United States Patent
Ferru et al.

(10) Patent No.: US 8,564,202 B2
(45) Date of Patent: Oct. 22, 2013

(54) LED PACKAGE AND METHOD FOR MANUFACTURING SUCH A LED PACKAGE

(75) Inventors: Gilles Ferru, Cairon (FR); Jacques Le Berre, Caen (FR)

(73) Assignee: NXP B.V., Eindhoven (NL)

( * ) Notice: Subject to any disclaimer, the term of this patent is extended or adjusted under 35 U.S.C. 154(b) by 844 days.

(21) Appl. No.: 12/740,412

(22) PCT Filed: Oct. 28, 2008

(86) PCT No.: PCT/IB2008/054442
§ 371 (c)(1),
(2), (4) Date: Apr. 29, 2010

(87) PCT Pub. No.: WO2009/057041
PCT Pub. Date: May 7, 2009

(65) Prior Publication Data
US 2010/0244691 A1    Sep. 30, 2010

(30) Foreign Application Priority Data
Nov. 1, 2007  (EP) .................................. 07291313

(51) Int. Cl.
*H01J 13/46* (2006.01)
(52) U.S. Cl.
USPC ............... 315/32; 445/23; 257/84; 257/59; 257/40; 257/98
(58) Field of Classification Search
USPC .......................................... 315/32; 445/23, 3
See application file for complete search history.

(56) References Cited

U.S. PATENT DOCUMENTS

| | | | | |
|---|---|---|---|---|
| 5,795,792 | A * | 8/1998 | Nishihara | 438/133 |
| 6,013,539 | A * | 1/2000 | Kashima et al. | 438/31 |
| 7,772,100 | B2 * | 8/2010 | Ferru et al. | 438/542 |
| 2001/0032985 | A1 * | 10/2001 | Bhat et al. | 257/88 |
| 2004/0256625 | A1 * | 12/2004 | Russell et al. | 257/80 |
| 2006/0022214 | A1 * | 2/2006 | Morgan et al. | 257/99 |
| 2006/0186819 | A1 | 8/2006 | Young | |
| 2006/0261742 | A1 | 11/2006 | Ng et al. | |
| 2006/0274540 | A1 | 12/2006 | Klaver et al. | |
| 2008/0179613 | A1 * | 7/2008 | Wendt et al. | 257/98 |

FOREIGN PATENT DOCUMENTS

| | | |
|---|---|---|
| EP | 0 702 347 A1 | 3/1996 |
| WO | 2006/023149 A2 | 3/2006 |
| WO | 2006/030191 A1 | 3/2006 |
| WO | 2007/121574 A1 | 11/2007 |
| WO | 2008/034242 A1 | 3/2008 |
| WO | 2008/131524 A | 11/2008 |

OTHER PUBLICATIONS

International Search Report and Written Opinion for Application PCT/IB2008/054442 (Oct. 28, 2008).

* cited by examiner

*Primary Examiner* — Daniel Cavallari
*Assistant Examiner* — Srinivas Sathiraju

(57) ABSTRACT

A LED package includes a LED die, and a memory device. The memory device is arranged for holding LED data information for driving the LED die. A LED driver arrangement includes a LED package as described above, a LED driver device and a microcontroller. The microcontroller is connected to the memory device for accessing the LED data information for driving the LED die and to the LED driver for sending an output flux settings signal. The LED driver device is connected to the LED die for providing a driving signal to the LED die, the driving signal being based on the output flux in package settings signal from the microcontroller.

12 Claims, 6 Drawing Sheets

LED PACKAGE AND METHOD FOR MANUFACTURING SUCH A LED PACKAGE

FIELD OF THE INVENTION

The present invention relates to a LED package comprising a LED element.

Also, the present invention relates to a LED driver arrangement, a method for manufacturing a LED package and a method of operation of a LED driver arrangement.

BACKGROUND OF THE INVENTION

Large-volume application of high-brightness LED elements (LED: Light emitting diode) is well established for signaling and signage. High-brightness LEDs are expected to replace conventional lamps in lighting applications within a few years.

High-brightness LEDs have been developed using GaN based materials. It is known that the optical and electrical properties of such LEDs may show a large variation. Output (radiative) flux, wavelength, forward voltage and resistivity may show a spread. In particular, the variation in these properties results in variation of the output flux from one LED to another for a given driving current.

EP 0 702 347 A1 discloses a dot-matrix LED display which has a data storage unit for storing brightness-corrected data prepared according to the characteristic brightness of each of the LEDs to minimize brightness difference among the LEDs.

US 2006/186819 A1 discloses a manufacturing process for storing measured light output internal to an individual LED assembly, and an LED assembly realized by the process. The process utilizes a manufacturing test system to hold an LED light assembly a controlled distance and angle from the spectral output measurement tool. Spectral coordinates, forward voltage, and environmental measurements for the as manufactured assembly are measured for each base color LED. The measurements are recorded to a storage device internal to the LED assembly. Those stored measurements can then be utilized in usage of the LED assembly to provide accurate and precise control of the light output by the LED assembly.

Furthermore, it is known to measure properties of LEDs after manufacturing, and classify the LEDs based on the results. The classification into classes or binnings is typically done based on output flux, wavelength and forward voltage of the LEDs.

Classified LEDs are then shipped to manufacturers of lighting applications.

Based on the binning information, LEDs can be selected, grouped and tuned for lighting applications. However, manufacturers of such lighting applications still encounter some obstacles: the logistics of selecting LEDs are extensive and complex and adversely affect achieving a reproducible temperature color of LEDs from one product of the lighting application to another.

SUMMARY OF THE INVENTION

It is an object of the present invention to provide a method for manufacturing a LED package that improves the logistics of selecting LED for lighting applications.

According to an embodiment there is provided a method of manufacturing a LED package comprising:—providing at least a LED die and a memory device;—assembling the LED die and the memory device into the LED package; the memory device being arranged for holding LED data information for driving the LED die.

According to another embodiment there is provided a LED driver arrangement comprising a LED package, a LED driver device and a microcontroller; the LED package comprising a LED die and a memory device; the memory device being arranged for holding LED data information for driving the LED die; the microcontroller being connected to the memory device for accessing the LED data information for driving the LED die; the microcontroller being connected to the LED driver for sending an output flux settings signal; the LED driver device being connected to the LED die for providing a driving signal to the LED die, the driving signal being based on the output flux settings signal from the microcontroller.

According to still another embodiment there is provided a method of operation for a LED driver arrangement comprising a LED package, a LED driver device and a microcontroller; the LED package comprising a LED die and a memory device; the memory device being arranged for holding LED data information for driving the LED die; the microcontroller being connected to the memory device for accessing the LED data information for driving the LED die; the microcontroller being connected to the LED driver for sending an output flux settings signal; the LED driver device being connected to the LED die for providing a driving signal to the LED die, the driving signal being based on the output flux settings signal from the microcontroller; the method being implemented in the microcontroller to allow the microcontroller to carryout:—accessing the memory device for reading the LED data information for driving the LED die;—receiving a light settings signal;—determining from the light settings signal in association with the LED data information the output flux settings signal for the LED die;—sending the output flux settings signal to the LED driver device.

For the purpose of teaching of the invention, aspects of the invention are described below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAIL DESCRIPTION OF THE EMBODIMENTS

Figure 1:
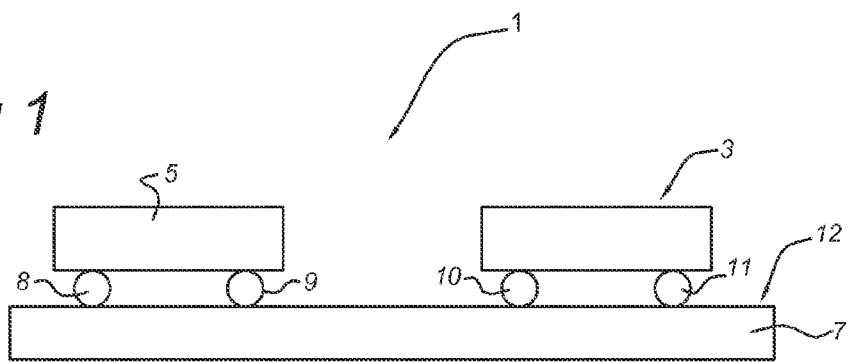
FIG. 1 shows a cross-sectional view of a LED package according to a first embodiment.

FIG. 1 shows a cross-sectional view of a LED package according to a first embodiment. The LED package 1 comprises a LED die 3, a memory device 5 and a submount 7. In a so-called flip-chip arrangement, the LED 3 and memory device 5 are fixed to the submount 7 by solder bumps 8, 9, 10, 11. The solder bumps also provide electrical connections of the LED 3 and the memory device 5 to the submount 7. The submount 7 is provided with additional contacts 12 for connection to a LED driver device (not shown) and a microcontroller (not shown). The additional contacts 12 comprise LED driving terminals for the LED driver device to drive the LED die 3 and memory access terminals for the microcontroller to access the memory device 5. The memory device 5 is arranged for holding LED data information which is relevant for driving the LED die 3. Such LED data information relates to optical and electrical properties of the LED die 3. The memory device may be either a read-only semiconductor memory device or a one-time-programmable memory device. The arrangement to access the information in the memory device 5 will be explained in more detail below with reference to FIGS. 6 and 7.

Figure 2:
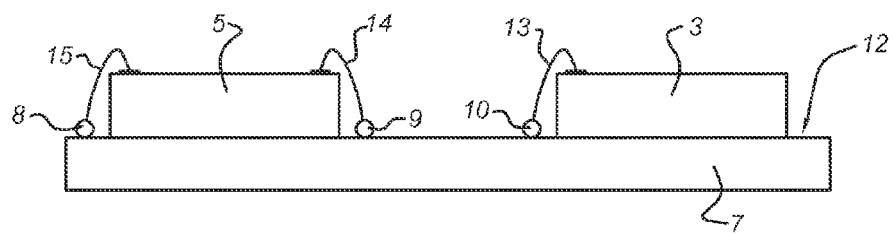
FIG. 2 shows a cross-sectional view of a LED package according to a second embodiment.

FIG. 2 shows a cross-sectional view of a LED package according to a second embodiment. In FIG. 2 entities with the same reference number as shown in the preceding Figure refer to the corresponding entities. In the LED package in the second embodiment the LED die 3 and the memory device 5 are bonded to the submount 7 by wire bonds 13, and 14, respectively. The wire bonds 13, 14, 15 provide electrical connections of the LED 3 and the memory device 5 to the submount 7.

Figure 3:
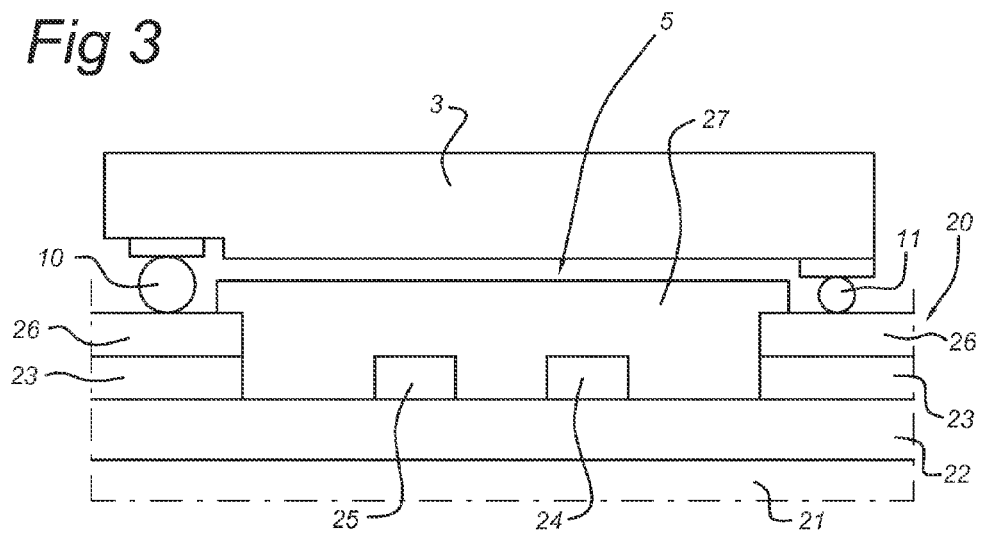
FIG. 3 shows a cross-sectional view of a LED package according to a third embodiment.

FIG. 3 shows a cross-sectional view of a LED package according to a third embodiment. The LED package according to the third embodiment comprises a LED die 3, a memory device 5 and a submount 20. The LED die 3 is mounted on the submount 20 in flip-chip arrangement with solder bumps 10, 11. In this embodiment, the memory device 5 is integrated as a circuit on a surface of the submount. The submount 20 comprises a carrier 21, which may be a semiconductor substrate e.g., a silicon substrate. On the carrier 21 an insulating layer 22 is arranged. The insulating layer 22 may consist of for example silicon dioxide or silicon nitride. On top of the insulating layer 22, a first patterned conducting layer 23 is arranged. On the first patterned conducting layer 23 a second patterned conducting layer 26 is stacked. Each solder bump 10, 11 is arranged to contact a respective portion of the stacked first and second patterned conducting layers 23, 26. Below the LED die 3, an area is located which comprises the memory device 5. On the submount 20, the memory device 5 is provided by means of a resistor array on the surface of the silicon substrate 21. Note that alternatively, the resistor array may be located on the surface of the silicon substrate 21 adjacent to the location of the LED die 3. The resistor array comprises a circuit of a plurality of fusible resistors which are illustrated here by metal line portions 24, 25. The circuit of fusible resistors is covered by a passivation layer 27. The circuit of fusible resistors will be illustrated in more detail with reference to FIG. 4.

Figure 4:
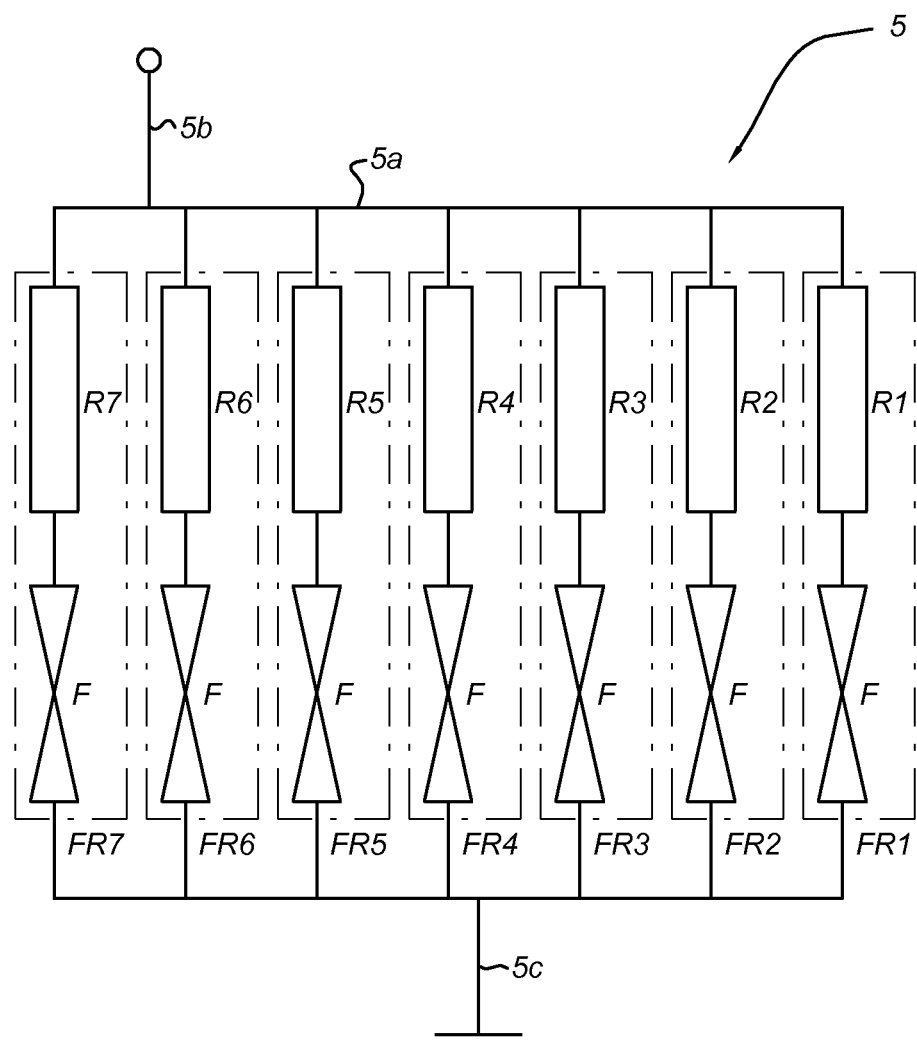
FIG. 4 shows a memory device circuit of a LED package in accordance with the present invention.

FIG. 4 shows a fusible resistor array as memory device circuit of the LED package according to an embodiment of the invention. The resistor array 5a comprises a plurality of fusible resistors FR1; FR2; FR3; FR4; FRS; FR6; FR7, a first terminal 5b and a second terminal 5c. The fusible resistors are arranged in a parallel connection to each other between the first terminal 5b and the second terminal Sc. During use, one of the first and second terminals 5b, 5c may be connected to ground voltage. Each fusible resistor comprises a fuse F and a resistor R1; R2; R3; R4; RS; R6; R7 in a series connection with the fuse. The resistors R1, R2, R3, R4, RS, R6, R7 are embodied as diffusion region in the silicon substrate 21.

In one embodiment, each resistor (R1-R7) is arranged to have a different resistance value, which during use limits the current going through the respective fuse. Fuses F are all substantially identical and arranged to be destroyable at a given designed-in maximum current density.

In an alternative embodiment, the fusible resistors may consist of metal line portions F without diffused resistors. Such arrangement of resistors may be used in cases in which the metal lines have such high resistance values that allow a detection circuit to detect differences of overall resistance of the resistor array with a sufficient accuracy. This embodiment may provide metal line portions of a conducting material with relatively high resistivity value in comparison to standard metallization metals such as aluminum. The LED package according to the embodiment of FIGS. 3 and 4 may be manufactured as illustrated by FIGS. 5a-5c.

Figure 5A:
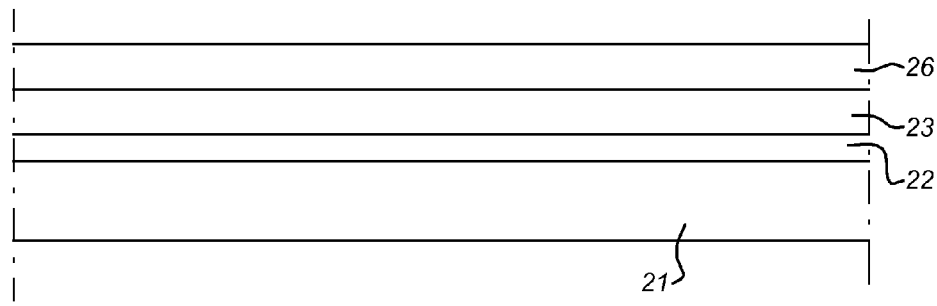
FIGS. 5a-5c show a cross-sectional view of a LED package in accordance with the present invention during manufacturing.

FIG. 5a shows a cross-sectional view of a LED package after a first manufacturing process. On the silicon substrate 21 a silicon dioxide layer 22 is grown or deposited. Next, the first conducting layer 23 is deposited, followed by the deposition of the second conducting layer 26. The first conducting layer 23 may comprise a Ti-W alloy. The second conducting layer 26 may comprise Aluminum.

Figure 5B:
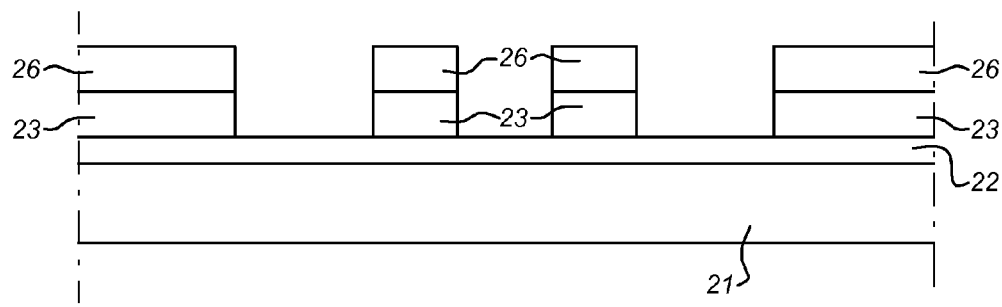

FIG. 5b shows a cross-sectional view of a LED package after a second manufacturing process. Next the stack of first and second conducting layer 23, 26 is patterned by photolithography and wet or dry etching. In this manner the first and second patterned conducting layers are formed. Also the fusible resistors are formed as line-shaped elements which in this stage each comprise a stack of the first conducting layer and the second conducting layer. It is noted that in this patterning step the line width and the thickness of the fusible resistors is important because it will determine the minimum current density needed for blowing the fusible resistors.

Figure 5C:
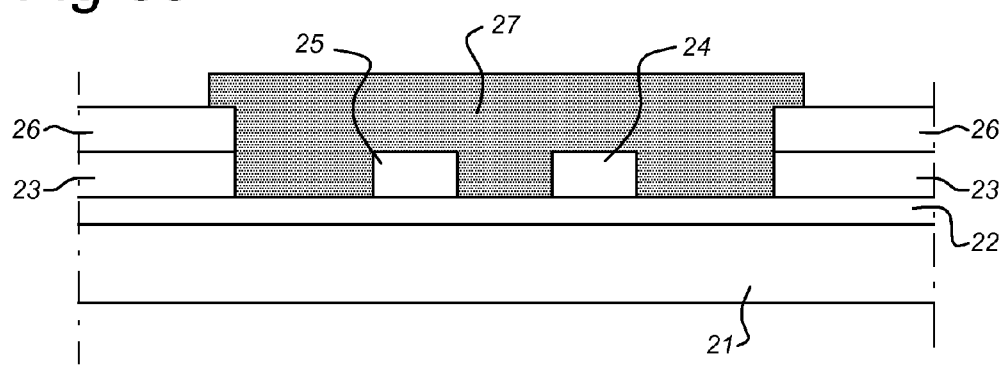

FIG. 5c shows a cross-sectional view of a LED package after a third manufacturing process. In a next process a second patterning is done. The first and second patterned conducting layers are covered by photoresist, except the line-shaped elements which are left exposed. Next, the exposed second conducting layer of the line-shaped elements is then etched by a etching process as known in the art. After etching the line-shaped elements comprise only the first conducting layer and form the fusible resistors 24, 25. Then, a passivation layer 27 comprising silicon dioxide and/or silicon nitride is deposited.

As shown in FIG. 3 above, the passivation layer 27 is patterned by photolithography and etching in order to have an opened area in the passivation layer for contacting the solder bumps 10, 11 to respective portions of the stacked first and second patterned conducting layers 23, 26. The solder bumps 10, 11 may be manufactured by any known technique. The solder bumps may be either stud bumps or electroplated bumps. The solder bumps may be manufactured from e.g., Au, Sn, Pb, Cu with metal barriers as Ni or Ti.

Subsequently, the LED die 3 will be soldered on the submount 20 or in flip chip arrangement depending on the LED type.

Programming of the resistor array as memory device can be done as follows.

When applying a given voltage over the terminals 5b, 5c of the resistor array, currents will flow through each fuse and resistor. When the current through a particular fuse exceeds the designed-in maximum current density, this will lead to the destruction of that fuse. By tuning the resistance values of the resistors and the applied voltage, one or more fuses can be destructed (blown) during a programming operation. As a consequence, the global resistance of the array can be changed according to the applied voltage. In this manner, the global resistance of the fusible resistor array can be used as an indicator for LED data information relevant for driving the LED die 3, when the global resistance is programmed on the basis of the measured properties of the LED die. It is noted that during manufacturing the resistance value of each resistor R1 ... R7 can be set in different ways:

A first method is by an implantation process to obtain a pre-determined impurity level a dopant element in the corresponding diffusion region of the respective resistor. Each resistor may have the same resistance value if all diffusion regions are provided with a substantially equal impurity level (by means of a single dopant implantation process for all diffusion regions). Alternatively, the resistance value of a resistor may be different from a resistance value of one or more of the remaining resistors, in case the impurity level of a diffusion region is controlled individually in the dopant implantation process.

A second method to create diffusion regions with different respective resistance value is by a lithographic process which creates diffusion regions of different respective width and/or length with a substantially same impurity level in every diffusion region (assuming a constant depth of each diffusion region). The resistance value of a diffusion region scales inversely proportional with its width, and proportional with its length. The latter second method is simpler and less expensive.

Figure 6:
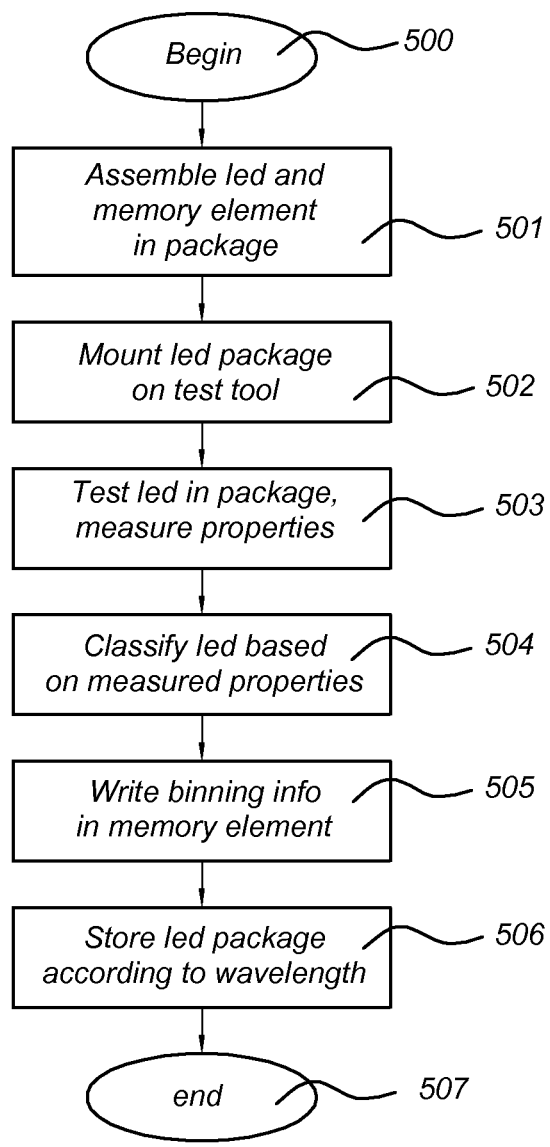
FIG. 6 shows a flow diagram of a method of manufacturing in accordance with the present invention.

FIG. 6 shows a flow diagram of a method of manufacturing in accordance with the present invention. First, LED dies 3 are manufactured in a usual manner as known by persons skilled in the art. Also, memory devices in any one of the preceding embodiments are manufactured. The method of manufacturing starts at some initial condition 500. In a first action 501, a LED die 3 and a memory device 5 are assembled in a LED package. The LED die and the memory device may be assembled on a submount, or alternatively, the memory device may be integrated as circuit on a surface of a submount. Further, a lens is mounted on the LED die. The LED die and the memory device are wired to contacts 12 on the LED package.

In a next action 502, the LED package is mounted on and electrically connected to a test tool. The test tool is provided with tool contacts that match the contacts 12 to the LED die and to the memory device on the LED package.

In action 503, the LED package is tested by measuring values of optical properties and/or electrical properties. From the measurement values, optical data (e.g., output flux as a function of current) and/or electrical data (e.g., forward voltage and resistance) are derived. For this purpose, the test tool may comprise a computation device or may be connected to a computation device. The computation device is capable of deriving the optical and electrical data from the measured values of optical properties and electrical properties, respectively.

In a further action 504, the tested LED die is classified based on the derived optical and electrical data. The classification may relate to binning classes that are defined for certain ranges of output flux and ranges of forward voltage and/or resistance. The ranges of output flux and of forward voltage and/or resistance may be combined for the definition of the binning classes. A classification code is generated based on a computation of the binning class from the derived optical and electrical data. The classification is carried out by the computation device of the test tool.

Next in action 505, the classification code is written in the memory device by the test tool.

Subsequently in action 506, the LED package is disconnected from the test tool. Based on the measured wavelength during testing, the LED package is stored in a corresponding bin.

By this classification method the binning procedure is strongly simplified. Only a binning based on the wavelength of the LED die in a LED package is still needed. Issues regarding the logistics are largely resolved in this manner, since the number of classes to handle is reduced to classes that only relate to the emitted wavelength of the LED die. The method ends at some second condition 507.

Figure 7:
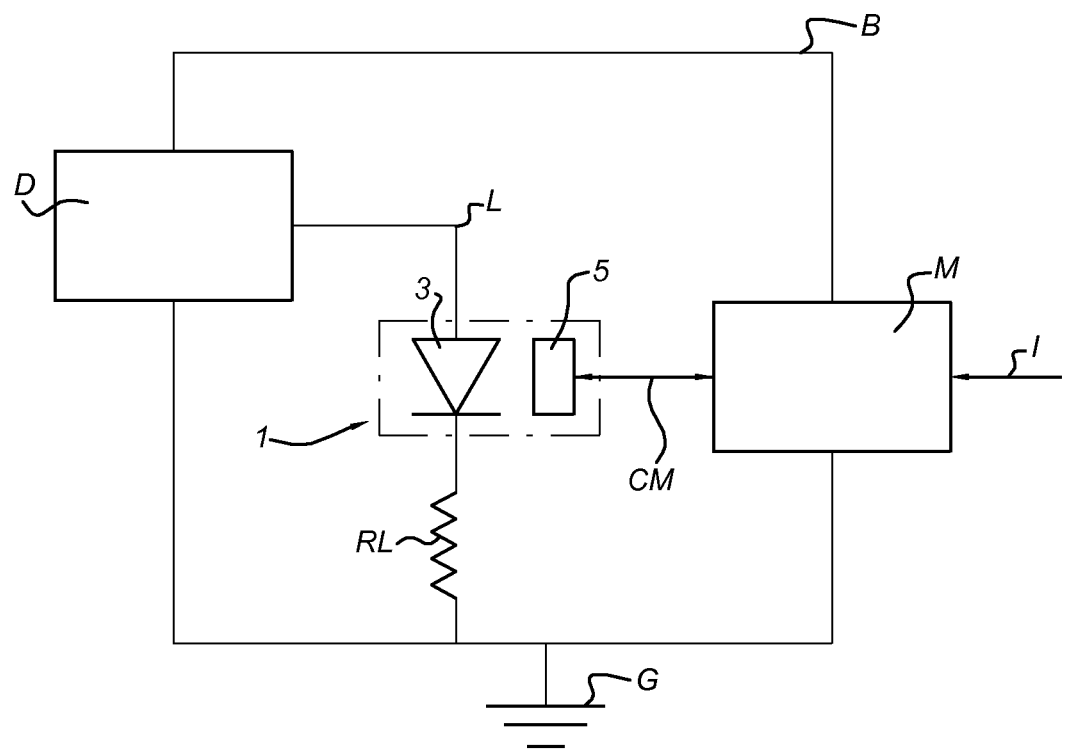
FIG. 7 shows schematically a LED driver arrangement in accordance with a further embodiment.

FIG. 7 shows schematically a LED driver arrangement in accordance with a further embodiment. The LED driver arrangement comprises a LED package 1, a LED driver device D, and a microcontroller M. The LED driver device D is in a first connection connected over a bus B with microcontroller M. Further, in a second connection L the LED driver device D is connected to the LED die 3 on the LED package 1. In a third connection the LED driver device D is connected to zero voltage level G.

The LED die 3 is on a first terminal connected to the LED driver device D over connection L and on a second terminal to a terminal of resistor RL. A second terminal of Resistor RL is connected to zero voltage level G.

The microcontroller M is connected to the memory device 5 by a connection CM. Also, the microcontroller M is connected to zero voltage level G. the microcontroller M comprises an input I for receiving light settings data from an external source (not shown).

The microcontroller M may comprise an internal memory. The internal memory may be arranged for storing instructions and data that relate to a method carried out by the microcontroller to control the LED driver device.

During use, the microcontroller M is arranged for receiving light settings data from an external source over connection I and for reading the classification code stored in the memory device 5 of the LED package 1. The microcontroller M is capable of determining of the optical properties of the LED die from the classification code. As described above, the classification code relates to LED data information for driving the LED die 3.

Based on the classification code and the received light settings data, the microcontroller is capable of determining an output flux setting for the LED driver device D. This output flux setting can be communicated by the microcontroller as an output flux settings signal to the LED driver device D over the bus B. In an exemplary embodiment the bus B may be an I²C bus.

The LED driver device D is arranged for receiving the output flux settings signal from the microcontroller M and for generating a driving signal for the LED die 3. The driving signal is communicated over connection L from the LED driver device D to the LED die 3.

By providing the classification code from the LED package to the microcontroller M, the optical and electrical properties of the LED die are available as data for controlling the light output of the LED die. Similarly, the light settings data can be parameterized and comprise at least a control parameter value indicating a relative amount of light to be generated by the LED die.

The microcontroller M is now capable to determine from such a control parameter value in combination with the classification code, the output flux to be generated by the LED driver device D. Accordingly, the microcontroller M can send the output flux settings signal to the LED driver device D over bus B. The light settings data are however not limited to only the control parameter value as described above; the light settings data may comprise additional data for the microcontroller to control the LED driver device D.

Figure 8:
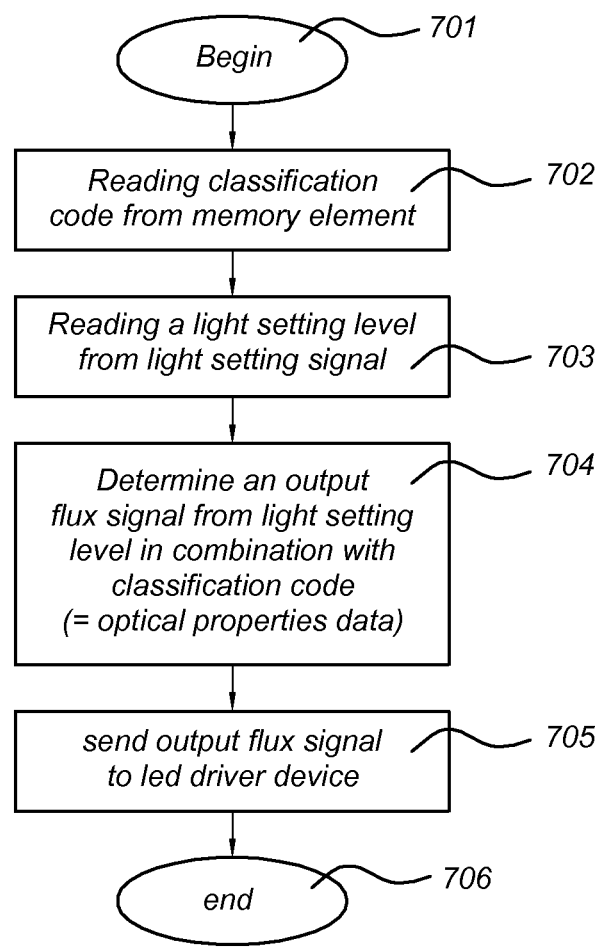
FIG. 8 shows a flow diagram for a method of operation of the LED driver arrangement.

FIG. 8 shows a flow diagram for a method of operation for the microcontroller of the LED driver arrangement as shown in FIG. 6.

The method of operation starts at a begin 701 which may be some initial condition. Possibly, the microcontroller M is in an idle state or carries out some initialization routine.

In a first action 702, the microcontroller M accesses the memory device 5 for reading the classification code stored in the memory device. Optionally, the microcontroller M may store the classification code data in an internal memory.

Next in action 703, the microcontroller receives a light settings level value from a light settings signal (e.g., through connection I as shown in FIG. 6). It is noted that optionally actions 702 and 703 may be carried out in reversed order.

In action 704, the microcontroller M determines from the light settings level value in association with the classification code obtained in action 702 an output flux level for the LED die 3.

From the classification code the microcontroller derives optical properties of the LED die which relate to at least the output flux as function of the LED current. From the output flux function derived from the classification code and the light settings level value, the microcontroller M determines an output flux signal. In a non-limiting manner, in the present invention a lookup table may be provided to relate the classification code with the optical properties of the LED die. As will be appreciated by persons skilled in the art, other means for establishing the relation between the classification code with the optical properties of the LED die may be used as well.

In action 705, the microcontroller sends the output flux signal to the LED driver device D over bus B.

In action 706, the method ends. The microcontroller M may enter an idle state at this point.

Based on the output flux signal received from the microcontroller M, the LED driver device D determines and generates a driving signal for the LED die 3. Typically, the driving signal relates to a drive current to supply to the LED die.

The descriptions above are intended to be illustrative, not limiting. It will be appreciated by the person skilled in the art that other alternative and equivalent embodiments of the invention can be conceived and reduced to practice without departing form the true spirit of the invention, the scope of the invention being limited only by the appended claims.

The invention claimed is:

1. A light emitting diode (LED) package comprising;
an LED die,
a memory device and the memory device being arranged for holding LED data information for driving the LED die: and
wherein the memory device comprises a plurality of fusible resistors arranged in a fusible resistor array; the fusible resistors being arranged in parallel to each other in between a first terminal and a second terminal of the fusible resistor array.

2. LED package accordint to claim 1, wherein each of the plurality of fusible resistors comprises a fuse in a series connection with a resistor.

3. LED package according to claim 2, wherein the resistor of each of the plurality of fusible resistors is embodied as a diffusion region in a semiconductor substrate carrier.

4. LED package according to claim 2, wherein at least one resistor of the plurality of fusible resistors has a resistance value different from at least one other resistor of the plurality of fusible resistors.

5. LED package according to claim 3, wherein the semiconductor substrate carrier is arranged as the submount.

6. LED package according to claim 1, wherein the LED data information for driving the LED die as accessed from the memory device is a classification code associated with measured optical and/or electrical properties of the LED die.

7. Method of manufacturing a LED package comprising;
providing at least a LED die, a memory device;
assembling the LED die and the memory device into the LED package; the LED die and the memory device being connected to respective contacts; the memory device being arranged for holding LED data information for driving the LEL die; and
testing the LED die by measuring values of optical properties and/or electrical properties of the LED die.

8. Method according to claim 7, comprising:
determining LED data information for driving the LED die from the measured values of optical and/or electrical properties.

9. Method according to claim 8, wherein LED data information for driving the LED die is associated with a classification code; the classification code being associated with one or more binning classes that are defined as a function of the measured optical and/or electrical properties.

10. Method according to claim 7, wherein the optical and electrical properties are selected from an output flux as a function of driving current of the LED die and/or from a forward voltage and/or a resistance value of the LED die.

11. Method of claim 8, comprising:
programming LED data information for driving the LED die in the memory device of the LED package.

12. Method according to claim 11, comprising:
binning the LED package as a function of a measured wavelength of the LED die during the testing of the LED die.

* * * * *